United States Patent [19]

Shindo

[11] Patent Number: 5,762,707
[45] Date of Patent: Jun. 9, 1998

[54] FLOATING ZONE MELTING APPARATUS

[75] Inventor: Isamu Shindo, Tsukuba, Japan

[73] Assignee: Cristal Systems, Inc., Yamanashi, Japan

[21] Appl. No.: 715,022

[22] Filed: Sep. 17, 1996

[51] Int. Cl.⁶ .................................................. C30B 35/00
[52] U.S. Cl. ............................. 117/200; 117/50; 117/204
[58] Field of Search ............................. 117/49, 50, 51, 117/52, 200, 204, 900

[56] References Cited

U.S. PATENT DOCUMENTS 4,184,065   1/1980   Nagashima ........................... 117/222

FOREIGN PATENT DOCUMENTS 63-274685A   11/1988   Japan.

*Primary Examiner*—Felisa Garrett
*Attorney, Agent, or Firm*—Wenderoth, Lind & Ponack

[57] ABSTRACT

The present invention provides an apparatus for permitting easy formation of a stable molten region and easy growing of even large-diameter single crystals, with a good-quality of single crystals, of which a floating zone melting apparatus of the infrared-ray concentrated heating type has halogen lamps at one side focal point of four oppositely arranged ellipsoidal reflecting mirrors along orthogonal axes with the inside surfaces thereof as the reflectors, and condensing infrared-rays reflected from the reflectors onto the other side focal point, thereby accomplishing heating, wherein the eccentricity is within a range of from 0.4 to 0.65.

18 Claims, 7 Drawing Sheets

Combination serial/parallel technique

Full parallel technique

Full serial technique 5,762,707

1

FLOATING ZONE MELTING APPARATUS

FIELD OF THE INVENTION

The present invention relates to a floating zone melting apparatus. More particularly, the present invention relates to a floating zone melting apparatus useful for growing single crystals and research on phase diagram.

PRIOR ART AND PROBLEMS

A conventionally known type of floating zone melting apparatus of the infrared-ray concentrated heating type which permits achievement of a high temperature at the focal point by using one or two ellipsoidal reflecting mirrors and causing these reflecting mirrors to collect light from a halogen lamp or a xenon lamp to a focal position, and is widely used for growing single crystals and research on phase diagram.

The conventional type of floating zone melting apparatus is advantageous in that melting of a sample can be performed without the use of a crucible, that any gas can be selected as an atmosphere, that application of the floating melting technique permits growing of single crystals of various compositions, that it is possible to conduct research on phase diagram by the application of the slow cooling float zone, and furthermore that a high temperature is easily achievable with a relatively small amount of electricity.

Among the conventional apparatuses, the type having two ellipsoidal reflecting mirrors is the most useful. The molten state of a sample is not however always ideal, but in a type of sample for which maintenance of stability of the melting zone is difficult, it is hard to breed high-quality single crystals.

The present invention was developed in view of the above-mentioned circumstances, and has an object to provide a novel floating zone melting apparatus which solves the problems involved in the prior art, and facilitates growing of high-quality single crystals.

SUMMARY OF THE INVENTION

As means to solve the above-mentioned problems, the present invention provides a floating zone melting apparatus of the infrared-ray concentrated heating type which comprises:

(a) four opposing ellipsoidal reflecting mirrors in a counter arrangement along orthogonal axes with the inside surfaces thereof as the reflecting surfaces;

(b) an infrared-ray, lamps provided at one side focal point of each of the four mirrors;

(c) heating by collecting infrared rays reflected from the reflecting surfaces at the other side focal point of each of the four mirrors; and wherein the eccentricity of the ellipsoidal reflecting mirrors is within a range of from 0.4 to 0.65.

The present invention further provides:

an embodiment wherein a halogen lamp having a plate-shaped filament is used as an infrared-ray lamp;

another embodiment wherein an infrared-ray lamp and a fan air-cooler for cooling the reflecting mirrors are independently provided;

a further another embodiment wherein the lamp is attached, of which the socket support position to a lamp holder is changeable while fixing the position of the lamp holder;

a further another embodiment wherein a plurality of supporting grooves are provided at certain intervals on a support section shaft, and there is provided a semi-fixed support structure which is fixed by inserting support members into the supporting grooves; and a further another embodiment wherein there is provided a three-dimensional structure in which a plurality of longitudinal lattices are arranged as screens for setting the positions of lamp filaments.

A further another embodiment wherein there are provided two upper and lower sets of shielding cylinders which shield light emitted from a lamp along the outer periphery of a transparent quartz tube set at the center so as to cover a rod-shaped sample to be heated and reflected on the reflecting mirrors, and the distribution of the light reaching the sample to be heated is adjusted through the gap between the upper and lower shielding cylinders while moving the shielding cylinder up and down; and a further another embodiment wherein the shielding cylinders are held by supporting jigs from outside the reflecting mirrors, and have a mechanism capable of setting the cylinders at optimum positions.

Figure 1:
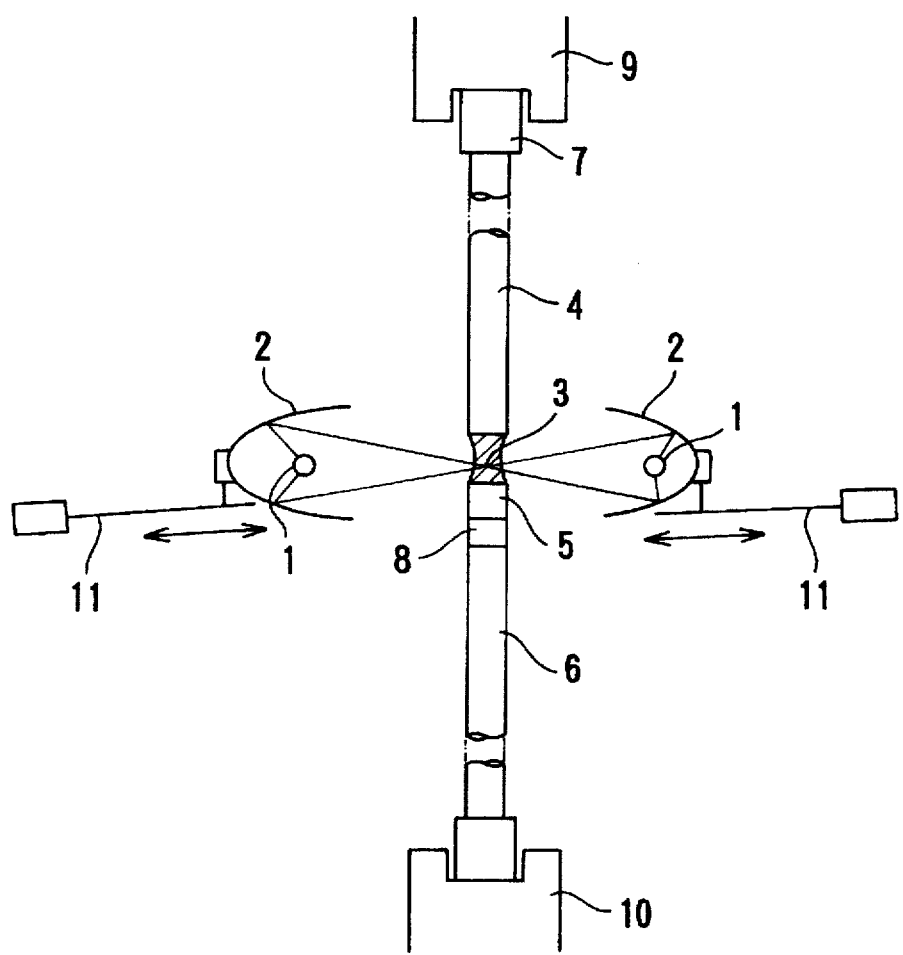
FIG. 1 shows a schematic configuration diagram illustrating an embodiment of the floating zone melting apparatus of the present invention.

In the drawings, the reference numerals represent the following components;

1. Halogen lamp
2. Ellipsoidal reflecting mirror
3. Sample melting section
4. Raw material rod
5. Bred crystals
6. Bred crystal support section
7. Raw material rod support section 8. Seed crystals
9. Raw material rod supporting drive
10. Bred crystal supporting drive
11. Lamp drive
12. Filament
13, 14. Fan air-coolers
15. Lamp holder
16. Socket
17. Lamp cap
18. Quartz bulb
19. Supporting shaft
20. Supporting groove
21. Support member
22. Screen
23. Longitudinal lattice
24. Longitudinal lattice plate
25. Upper shielding cylinder
26. Upper shielding cylinder holder (with a moving mechanism)
27. Transparent quartz tube
28. Lower shielding cylinder
29. Lower shielding cylinder holder (with a moving mechanism)

DETAILED DESCRIPTION OF THE INVENTION

Now, some embodiments of the present invention will be described below in detail.

<1> Shape of ellipsoidal reflecting mirror

What is evident from the background of the present invention is that, as the floating zone melting technique is generally a method for causing a sample itself to hold a formed molten liquid, the amount of molten liquid capable of being stably retained is limited by the correlation between surface tension and specific gravity of the molten liquid.

In order to stabilize a molten zone and thus to permit growing of single crystals having a large grain size, it is understood that a steep temperature gradient is required in the vertical direction. When growing large-sized single crystals under a slow temperature gradient, the amount of molten liquid exceeds the limit near the surface in spite of the not yet melted state of the center portion, it becomes very difficult to retain the molten liquid.

When collecting light of a lamp by means of an ellipsoidal reflecting mirror, in general, by using a constant shape of filament, the shape of a high-temperature region formed at a focal point largely varies with eccentricity of the ellipsoidal reflecting mirror, as defined by the following formula:

$$(a^2+b^2)^{1/2}/a$$

(where, a is a length of the major axis, and b is a length of the minor axis).

A larger eccentricity corresponds to a larger high-temperature region, and to a slower temperature gradient, accordingly leading to a lower maximum ultimate temperature. In order to achieve a steep temperature gradient, therefore, a smaller eccentricity is more favorable.

However, in a floating zone melting apparatus using particularly four opposing ellipsoidal reflecting mirrors, a smaller eccentricity leads to mutual collision of the reflecting mirrors, so that overlapping portions of the reflecting mirrors must be cut off. This reduces reflection of the light of the lamp by the extent corresponding to the cutoff portions of the reflecting mirrors, thus leading to a lower utilization efficiency of light and to a lower maximum ultimate temperature. It is not therefore favorable to carelessly reduce eccentricity.

In view of this fact, the present inventors actually studied conditions permitting stable growing of single crystals by changing eccentricity of the ellipsoidal reflecting mirrors. As a result, the efficiency was found to be the most excellent within a range of eccentricity of the ellipsoidal reflecting mirrors of from 0.4 to 0.65, giving a steep temperature gradient befitting the actual growing of single crystals.

<2> Shape of lamp filament

On the other hand, the shape of lamp filament exerts as well an important effect on light condensing efficiency and status. The optimum shape of filament varies also with the number of the ellipsoidal reflecting mirrors.

The present inventors therefore studied the filament shape suitable for growing high-quality single crystals by using four ellipsoidal reflecting mirrors oppositely arranged along orthogonal axes. As a result, a plate-shaped filament was found to be optimum. It was confirmed that the most stable molten region could be easily formed by using a plate-shaped filament having almost square shape and a halogen lamp of which the plate surface is horizontally arranged.

On the basis of the above-mentioned findings, the present invention provides a floating zone melting apparatus of the infrared-ray concentrated heating type using four oppositely arranged ellipsoidal reflecting mirrors, which achieves a steep temperature distribution and permits growing of high-quality single crystals by using ellipsoidal reflecting mirrors having an eccentricity within a range of from 0.4 to 0.65.

<3> Cooling of lamp

In the floating zone melting apparatus, it is necessary to appropriately cool both the lamp and the reflecting mirrors. In the present invention, air cooling using a simple and inexpensive fan is adopted. Here, the installing spot and the size of the fan are important. A fan produces an air flow by rotating blades, no air flow is produced at the center of rotation. More specifically, a fan as large as the reflecting mirror cannot sufficiently, cool the lamp installed in the center portion. A small fan sufficient to cool the lamp poses in contrast a problem of insufficient cooling of the reflecting mirror. In the present invention, therefore, separate air-cooling fans meeting the respective sizes of the infrared-ray lamp and the reflecting mirrors are installed. This permits sufficient cooling of both the lamp and the mirrors.

<4> Holding of lamp

Because of the necessity to manufacture a special halogen lamp to meet a particular apparatus, it costs as much as 4 to 60,000 yen. For example, as shown in FIGS. 1–4, in the equipment configuration of the present invention, four such expensive halogen lamps are used at a time, resulting in the problem of high cost. When lamps of various outputs are used in successive replacements, quartz bulbs (18) are different in size between lamps of small and large outputs. When attaching an infrared-ray lamp through a lamp cap (17) to a lamp holder (15) with a socket (16), it is necessary to adjust the position of the lamp holder (15).

While it has been necessary to change the filament size when replacing a lamp with another having a different output, the conventional technique has used a structure in which the same lamp holder (15) could be used with no further change by fixing the size of the quartz bulb (18) and particularly the positional relationship between the holder (15) and the filament (12).

However, in this conventional practice, when using a small quartz bulb (18) for a large-output infrared-ray lamp having a large filament (12), the surface area of the quartz bulb (18) in contact with the open air becomes smaller, resulting in insufficient release of a large amount of heat generated by a large filament, thus seriously reducing the service life of the infrared-ray lamp (1). When using a large quartz bulb for a small-output infrared-ray lamp (1) having a small filament, on the contrary, the size of the quartz bulb (18) is too large for the size of the filament and the surface area of the quartz bulb in contact with the open air becomes unnecessarily larger, thus posing a problem of excessive cooling.

When using a halogen lamp as an infrared-ray lamp, furthermore, the filament is made of tungsten: tungsten is vaporized at high temperatures, adheres to the bulb (18), of which the inner wall gradually becomes blackish, this tending to cause the temperature to easily increase, thus leading to a sooner expiration of the life. With a view to extending the service life, it is the conventional practice to seal a halogen gas in the quartz bulb (18) to cause tungsten volatile at high temperatures to react with halogen and thus to generate tungsten halide, decompose tungsten halide on the high-temperature filament into tungsten and halogen gas, cause precipitation of tungsten onto the filament, and release and return the halogen gas. This reaction known as halogen cycle is utilized in an attempt to extend the service life. In order to ensure normal continuation of this halogen cycle, however, it is necessary to keep a temperature above an appropriate level not causing solidification of the produced tungsten halide (at least 400° C. in general), and keep a temperature below a heat resistant level of the quartz bulb (18) (up to 800° C. in general). An excessively low temperature therefore reduces the life. More particularly, if the quartz bulb (18) is too large for a small-output lamp having a small filament (12), the produced tungsten halide would precipitate at portions at low temperatures, thus reducing the life and posing problems such as unstable output.

The present invention therefore uses a construction in which the position of the lamp holder (15) is movable to permit continued use of a quartz bulb (18) having a size meeting that of the filament (12).

More specifically, keeping the fixed position of the lamp holder (15), the socket support position to the lamp holder (15) is changed to achieve a construction capable of absorbing changes in the filament size and the quartz bulb (18) size. It is thus possible to use various lamps of different outputs in replacement while keeping a fixed position of attachment of the cooling fan.

<5> Support of supporting section shaft

In a floating zone melting apparatus, furthermore, it is necessary to vertically move, by means of the bred crystals supporting drive and the raw material rod supporting drive, the grown crystals support section and the raw material rod support section at every charge and discharge of sample and attachment and detachment of the quartz tube, to temporarily hold same, and to firmly hold the same at appropriate positions during growing of crystals. Since sample rods often have different lengths, these support sections should preferably be kept firmly at any position.

Conventional methods for supporting bred crystals and raw material rods are as follows:

(a) Fixed support

A holding member of the support section shaft is provided and the shaft is fixed to it. In this method, while ensuring complete fixing, it is difficult to cope with arbitrary changes in sample length, because the position for holding the support section shaft is fixed, and a jig for correcting the difference in length is required.

(b) Collet chuck

This method is advantageous in that the support section shaft can be kept at any position by using a collet chuck as a supporting jig of the supporting section shaft. In this method, however, when the sample room is brought to a high pressure, the collet chuck alone cannot provide perfect keeping of the supporting section, requiring another keeping jig. Under a high pressure, therefore, the fixed support is more excellent.

In the floating zone melting apparatus of the present invention, therefore, the semi-fixing technique is adopted, which comprises providing attachment supporting grooves at intervals of several millimeters on a supporting shaft, and inserting support members into these attachment supporting grooves for fixation. In this technique, the support section shaft is perfectly fixed and can be fixed at any position, although at intervals of several millimeters, thus actually permitting fixation at any arbitrary position.

<6> Method for positioning focal point

In an optical floating zone melting apparatus, it is important to set the filament position of the lamp accurately at the focal point. The conventional technique comprises previously setting a screen made of ground glass at the focal point position, and forming an image of the filament onto this screen, thereby accurately setting the filament position.

In this conventional technique, however, while accurate positioning is possible within the screen surface, the depth cannot be known at all. It is therefore necessary to appropriately derive the position considered the center by moving the lamp forward and back. This operation is not only troublesome, but also poses the problem of poor accuracy.

In the floating zone melting apparatus of the present invention, therefore, a three-dimensional structure provided with a plurality of longitudinal lattices is adopted as a method permitting three-dimensional determination of an accurate position of the filament.

<7> Adjustment of light distribution by shielding cylinders:

The temperature gradient in the vertical direction largely depends upon the optical absorption property of the rod-shaped sample, and it may sometimes be difficult to form a stable melt. In the present invention, therefore, shielding cylinders are provided above and below the sample melt, and in addition, there is provided a mechanism for adjusting the position of these shielding of these shielding cylinders. By adjusting the positions of the upper and lower shielding cylinders, it is possible to adjust the distribution of the light reaching the sample. It is therefore possible to provide an optimum temperature condition for stably holding the sample melt over a wide range of temperature gradients from a relatively slow temperature gradient up to a steep temperature gradient.

When the shielding cylinder is divided into two sections in the longitudinal direction, the shielding cylinder does not hinder engagement/disengagement of a sample and attachment/detachment of the transparent quartz tube and ensures smooth operation.

While any material which can shield the light may be used for the shielding cylinder, an alumina-based ceramic pipe is desirable as an inexpensive material applicable even at relatively high temperature.

Now, embodiments of the present invention are described in detail by means of examples.

EXAMPLES

FIG. 1 attached thereto shows an embodiment of the floating zone melting apparatus of the present invention.

As shown in FIG. 1, the floating zone melting apparatus of the present invention comprises four halogen lamps (1) as infrared-ray lamps, ellipsoidal reflecting mirrors (2) corresponding thereto, a sample melting section (3), a raw material rod (4), bred crystals (5), a bred crystal support section (6), a raw material rod support section (7), seed crystals (8), a raw material rod supporting drive (9), a bred crystal supporting drive (10), and an infrared-ray lamp drive (11).

Single crystals are bred by the use of this apparatus as follows. First, the raw material rod (4) is set on the raw material rod support section (7), and seed crystals (8), on the grown crystal support section (6). The tip portions of both the raw material rod (4) and the seed crystals (8) are melted by turning on the individual halogen lamps (1) and gradually increasing voltage applied to the halogen lamps (1). At the moment when both tip portions have been melted, the both tip portions are brought closer to form an integrated molten portion. At this point, rotation is imparted to both the raw material rod (4) and the seed crystals (8), and by controlling power fed to the halogen lamps (1), the size of the molten portion is adjusted to form a stable molten region. By moving the positions of the halogen lamps (1) by means of the halogen lamp drive (11) while paying attention not to cause abnormality in the shape of the thus formed molten region, or, by slowly causing transfer of the raw material rod (4) and the seed crystals (8) at a prescribed speed by means of the raw material rod supporting drive (9) and the grown crystal supporting drive (10), melting of raw materials and growing of crystals are continued and single crystals are grown. Whether or not the formed molten region can be stably held is an important factor for growing good-quality single crystals.

Figure 11:
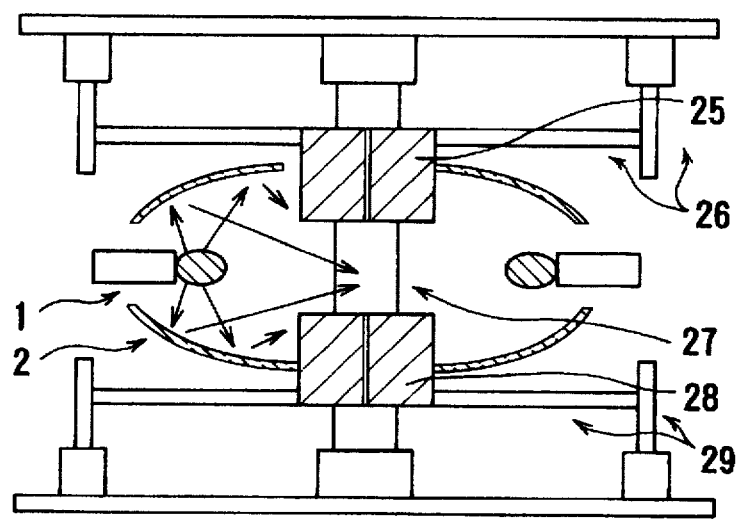
FIG. 11 is a schematic configuration diagram illustrating an embodiment of the method of adjusting the light distribution in the vertical direction by means of shielding cylinders.

There is further available an embodiment of the floating zone melting apparatus provided with upper and lower shielding cylinders as shown in FIG. 11 as means for adjusting changes in temperature distribution in the vertical direction caused by optical absorption property of the raw material rod (4) and the seed crystal (8). As shown in FIG. 11, an upper shielding cylinder (25) and a lower shielding cylinder (28) are arranged at the center of the basic apparatus shown in FIG. 1. An upper shielding cylinder holder (26) and a lower shielding cylinder holder (29) have a moving mechanism, and move up and down along the outer periphery of a transparent quartz tube (27) which covers the rod-shaped sample to be heated. By adjusting the positions of the upper and lower shielding cylinders, it is possible to select an optimum temperature gradient from temperature gradients widely ranging from a slow one to a steep one.

Figure 2A:
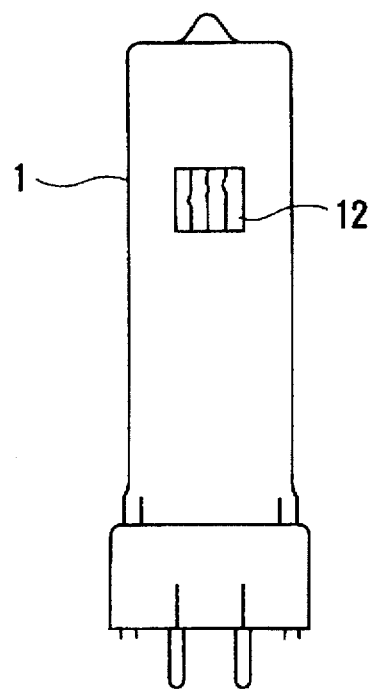
FIGS. 2 (a) and (b) show a front view and a side view illustrating the filament shape of the halogen lamps used in the present invention.
Figure 2B:
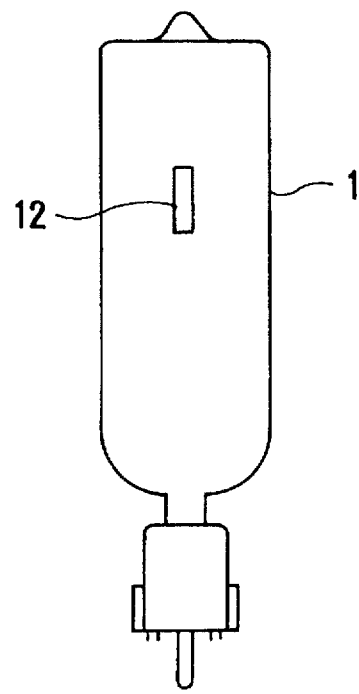

FIG. 2 attached hereto shows the shape of a filament of the halogen lamp (1) used in the present invention.

By using a plate-shaped almost square filament (12), as shown in FIG. 2, there is available a temperature condition favorable for growing better-quality single crystals.

Figure 3:
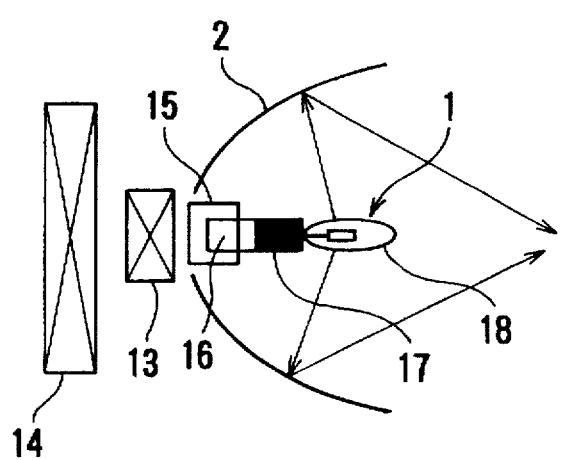
FIG. 3 shows a schematic configuration diagram illustrating an embodiment of an arrangement of the lamp attachment portion and the cooler.

FIG. 3 shows an embodiment of the structure of the attachment section of the halogen lamp (1) of the embodiment of the floating zone melting apparatus shown in FIG. 1: a fan air-cooler (13) for the halogen lamps (1) and a fan air-cooler (14) for the reflecting mirrors (2) are separately provided to ensure sufficient cooling of the lamps (1) and the reflecting mirrors (2).

Figure 4:
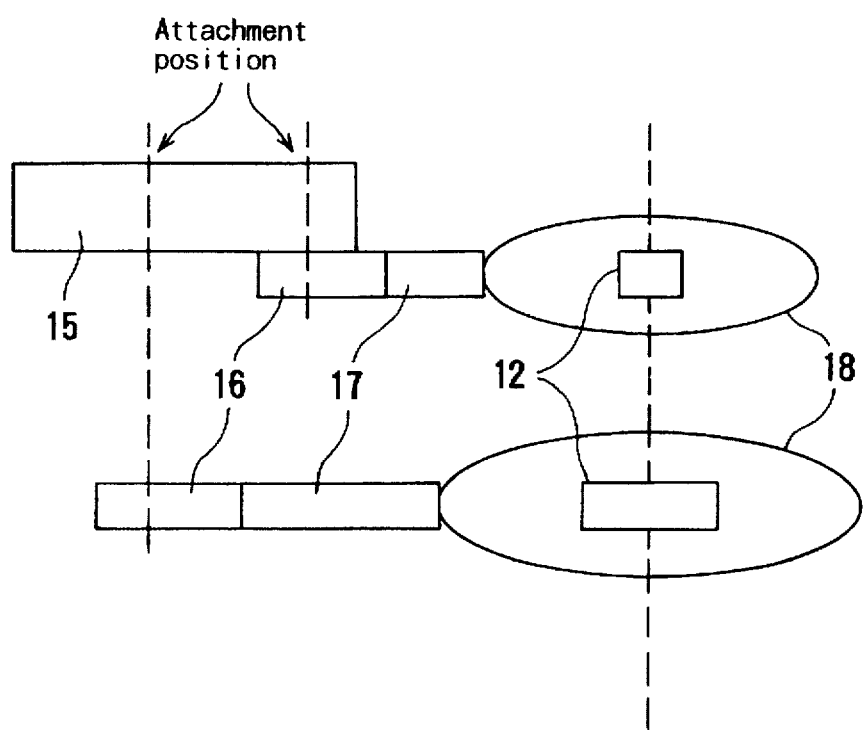
FIG. 4 shows a schematic configuration diagram illustrating an embodiment of the lamp attaching position to the lamp holder.

The halogen lamp (1) is fixed by attaching a lamp cap (17) via a socket (1.6) to a lamp holder (15). This attachment of the lamp (1) to the holder (15) makes the support position of the socket (16) to the lamp holder (15) variable, while keeping the fixed position of the lamp holder (15), as shown in FIG. 4. This permits control of exothermal changes caused by a change in size of the filament (12) or the size of the quartz bulb (18).

That is, the quartz bulb (18) having a size meeting that of the filament (12) can be used as it is.

Figure 5:
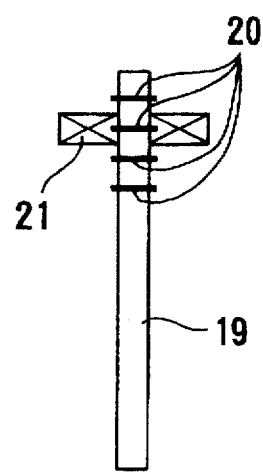
FIG. 5 shows a schematic sectional view illustrating an embodiment of the attaching and fixing structure of the supporting shaft.

FIG. 5 schematically shows the structure of shaft support of the raw material rod (4): supporting grooves (20) are provided at intervals of several millimeters on a supporting shaft (19) so as to permit insertion of supporting members (21) into these grooves for fixation.

This ensures perfect fixing, and it is thus possible to fix practically at any position.

Figure 6:
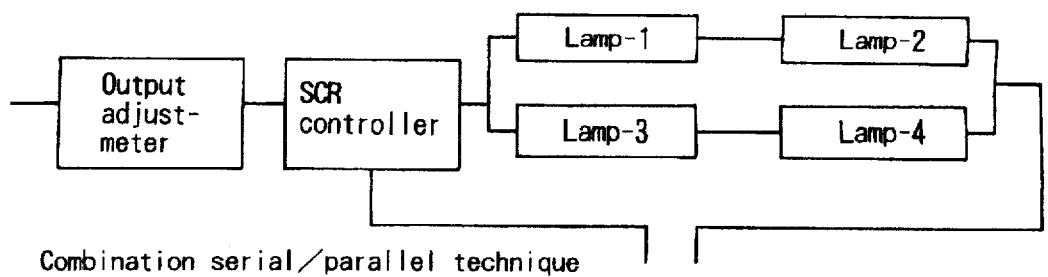
FIG. 6 shows a block diagram illustrating the combination serial/parallel technique for output control of the halogen lamp in an embodiment.
Figure 7:
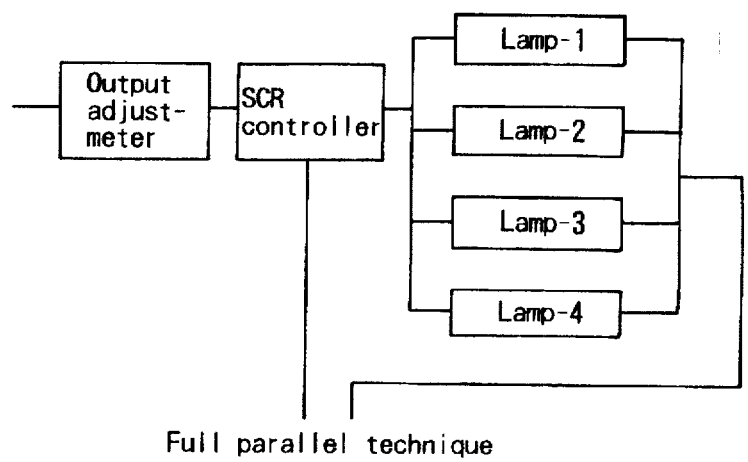
FIG. 7 shows a block diagram illustrating the full parallel technique for lamp control.
Figure 8:
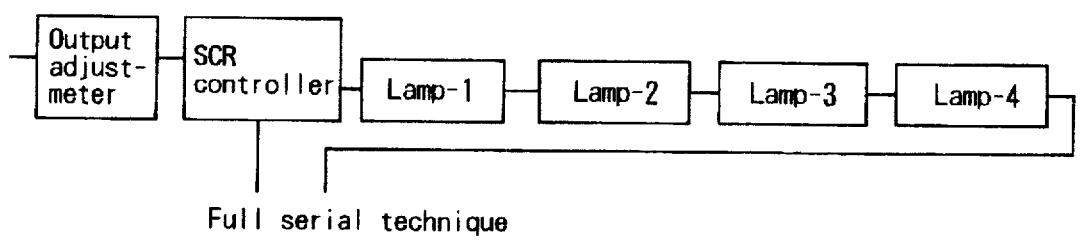
FIG. 8 shows a block diagram illustrating the full serial technique for lamp control.

FIG. 6 is a block diagram illustrating the configuration of the combination serial/parallel technique as a method for output control of the above-mentioned four halogen lamps (1). FIGS. 7 and 8 show configurations of the full parallel and the full serial techniques as other methods for output control.

In the case of the full parallel technique shown in FIG. 7, control is possible with a voltage of 100 V or 200 V, but an excessive current makes control slightly more complicated. Because current tends to concentrate on lamps allowing easy flow of current, there may occur temperature unevenness. In the full serial technique shown in FIG. 8, such a high voltage as 400 V is required if each lamp is for use under a voltage of 100 V. This technique is not therefore very practicable.

In the combination serial/parallel technique shown in FIG. 6, in contrast, lamps for 100 V can be used under 200 V, and the technique is hardly affected by fluctuation of resistance value of the lamps.

Figure 9:
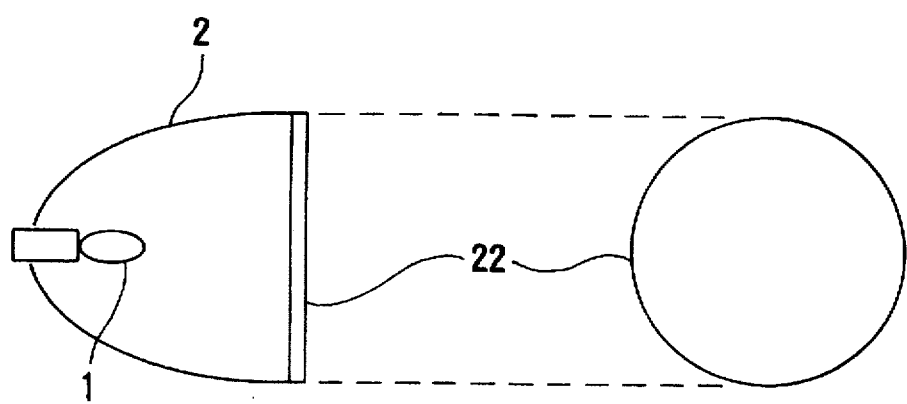
FIG. 9 shows a schematic representation showing conventional setting of the filament position using a screen.

In the apparatus of the present invention, it is possible to adopt a method for accurately and more easily setting the position in depth as well in place of the conventional method of forming an image of the filament on a screen (22) prepared from a ground glass plate, thereby setting a position of the filament, as shown in FIG. 9.

Figure 10A:
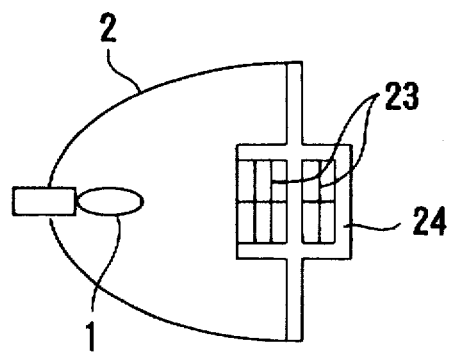
FIGS. 10(a), (b) and (c) show a side view, a front view and a perspective view illustrating the three-dimensional structure for setting the filament position in the present invention.
Figure 10B:
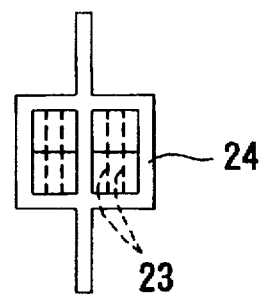
Figure 10C:
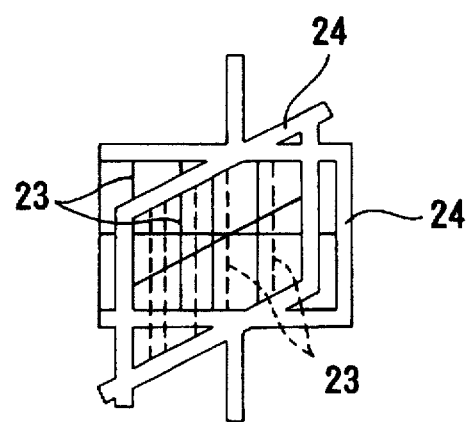

The means for this method is the three-dimensional structure provided with a plurality of longitudinal lattices (23) shown in FIGS. 10(a), (b) and (c), i.e., the structure having an orthogonal longitudinal lattice sheet (24).

The filament set at the focal point position on one side of the spheroidal mirrors is projected onto another focal point position. Since this projected image is viewed as if it is floating in the air, placing a three-dimensional lattice at the focal point position clearly demonstrates the relationship between the lattice and the projected image and facilitates adjustment of the focal point position.

Because the filament position must be set at three-dimensionally correct position in the space, it is recommended to use such a method of inspection and adjustment.

This makes it possible to derive a three-dimensionally accurate filament position.

Single crystals were therefore actually bred by using the floating zone melting apparatus having four ellipsoidal reflecting mirrors as shown in the above-mentioned drawings including FIG. 1. It was possible to grow good-quality single crystals having a large diameter at the highest efficiency from those having an eccentricity with a range of from 0.4 to 0.65. With an eccentricity of over 0.65, on the other hand, it was difficult to retain a molten liquid and therefore to grow good-quality single crystals having a large diameter. With an eccentricity of under 0.4, the growing efficiency was too low to be practicable, resulting in a poor quality of single crystals.

According to the present invention, as described above in detail, it is possible to form a far more stable molten region than in the method based on the conventional apparatus, and to easily grow large-diameter single crystals, resulting in higher-quality single crystals than in the conventional method.

What is claimed is:

1. A floating zone melting apparatus of an infrared-ray t concentrated heating type, the apparatus comprising:

a first pair of opposing ellipsoidal reflecting mirrors disposed along a first axis;

a second pair of opposing ellipsoidal reflecting mirrors disposed along a second axis, wherein said first axis is orthogonal with respect to said second axis and each of said ellipsoidal reflecting mirrors has inside reflecting surfaces; and four infrared-ray lamps provided in the vicinity of said ellipsoidal reflecting mirrors, respectively, wherein each of said infrared-ray lamps is provided at one side focal point of said respective ellipsoidal reflecting mirror, and heating is accomplished by collecting infrared rays reflected from said reflecting surfaces at the other side focal point of said ellipsoidal reflecting mirrors which each have an eccentricity which is within a range of from 0.4 to 0.65 and is defined by the following formula:

$$(a^2+b^2)^{1/2}/a$$

where a is the length of the major axis, and b is the length of the minor axis.

2. The floating zone melting apparatus as claimed in claim 1, further comprising:

a plurality of fan air-coolers for cooling said infrared-ray lamps, respectively; and a plurality of fan air-coolers for cooling said ellipsoidal reflecting mirrors, respectively.

3. The floating zone melting apparatus as claimed in claim 2, further comprising a plurality of fixed lamp holders connected to said infrared-ray lamps, wherein each of said holders are connected to said respective lamp via a socket which is movably attached to said holder such that a support position of said socket is variable.

4. The floating zone melting apparatus as claimed in claim 2, further comprising:

a support shaft, disposed on a central axis which is orthogonal with respect to said first and second axes, for supporting a raw material rod;

a plurality of grooves formed in said support shaft; and a supporting member adjustably secured on said support shaft by said grooves.

5. The floating zone melting apparatus as claimed in claim 2, further comprising a three-dimensional structure in which a plurality of longitudinal lattices are arranged as screens for setting the positions of lamp filaments of said infrared-ray lamps.

6. The floating zone melting apparatus as claimed in claim 1, wherein each of said infrared-ray lamps comprise a halogen lamp having a plate-shaped filament.

7. The floating zone melting apparatus as claimed in claim 6, further comprising:

a plurality of fan air-coolers for cooling said halogen lamps, respectively; and a plurality of fan air-coolers for cooling said ellipsoidal reflecting mirrors, respectively.

8. The floating zone melting apparatus as claimed in claim 7, further comprising a plurality of fixed lamp holders connected to said halogen lamps, wherein each of said holders are connected to said respective lamp via a socket which is movably attached to said holder such that a support position of said socket is variable.

9. The floating zone melting apparatus as claimed in claim 7, further comprising:

a support shaft, disposed on a central axis which is orthogonal with respect to said first and second axes, for supporting a raw material rod;

a plurality of grooves formed in said support shaft; and a supporting member adjustably secured on said support shaft by said grooves.

10. The floating zone melting apparatus as claimed in claim 7, further comprising a three-dimensional structure in which a plurality of longitudinal lattices are arranged as screens for setting the positions of lamp filaments of said halogen lamps.

11. The floating zone melting apparatus as claimed in claim 6, further comprising a plurality of fixed lamp holders connected to said halogen lamps, wherein each of said holders are connected to said respective lamp via a socket which is movably attached to said holder such that a support position of said socket is variable.

12. The floating zone melting apparatus as claimed in claim 6, further comprising:

a support shaft, disposed on a central axis which is orthogonal with respect to said first and second axes, for supporting a raw material rod;

a plurality of grooves formed in said support shaft; and a supporting member adjustably secured on said support shaft by said grooves.

13. The floating zone melting apparatus as claimed in claim 6, further comprising a three-dimensional structure in which a plurality of longitudinal lattices are arranged as screens for setting the positions of lamp filaments of said halogen lamps.

14. The floating zone melting apparatus as claimed in claim 1, further comprising a plurality of fixed lamp holders connected to said infrared-ray lamps, wherein each of said holders are connected to said respective lamp via a socket which is movably attached to said holder such that a support position of said socket is variable.

15. The floating zone melting apparatus as claimed in claim 1, further comprising:

a support shaft, disposed on a central axis which is orthogonal with respect to said first and second axes, for supporting a raw material rod;

a plurality of grooves formed in said support shaft; and a supporting member adjustably secured on said support shaft by said grooves.

16. The floating zone melting apparatus as claimed in claim 1, further comprising a three-dimensional structure in which a plurality of longitudinal lattices are arranged as screens for setting the positions of lamp filaments of said infrared-ray lamps.

17. The floating zone melting apparatus as claimed in claim 1, further comprising:

a transparent quartz tube for covering a rod-shaped sample to be heated;

an upper shielding cylinder movably disposed on said transparent quartz tube; and a lower shielding cylinder movably disposed on said transparent quartz tube, wherein a gap is formed between said upper and lower shielding cylinders and said gap is adjustable by moving said upper and lower shielding cylinders along said transparent quartz tube.

18. The floating zone melting apparatus as claimed in claim 17, wherein said shielding cylinders are held by supporting jigs from outside the reflecting mirrors, and include a mechanism which is capable of setting said shielding cylinders at optimum positions.

* * * * *

UNITED STATES PATENT AND TRADEMARK OFFICE
CERTIFICATE OF CORRECTION

PATENT NO. : 5,762,707
DATED : June 9, 1998
INVENTOR(S) : Isamu SHINDO

It is certified that error appears in the above-identified patent and that said Letters Patent is hereby corrected as shown below:

column 3, line 49 change "$(a^2+b^2)^{\frac{1}{2}}/a$" to --$(a^2-b^2)^{\frac{1}{2}}/a$--; and
column 9, line 22 change "$(a^2+b^2)^{\frac{1}{2}}/a$" to --$(a^2-b^2)^{\frac{1}{2}}/a$--.

Signed and Sealed this

Seventeenth Day of October, 2000

Attest:

Q. TODD DICKINSON

*Attesting Officer*     *Director of Patents and Trademarks*